US006897147B1

United States Patent
Tsai et al.

(10) Patent No.: US 6,897,147 B1
(45) Date of Patent: May 24, 2005

(54) SOLUTION FOR COPPER HILLOCK INDUCED BY THERMAL STRAIN WITH BUFFER ZONE FOR STRAIN RELAXATION

(75) Inventors: Shin-Yeu Tsai, Sinying (TW); Po-Hsiung Leu, Lujhu Township, Taoyuan County (TW); Chia-Ming Yang, Hsin-Chu (TW); Tsang-Yu Liu, Kaoshiong (TW); Yun-Da Fan, Hsinchu (TW); Chen-Peng Fan, Sinfong Township, Hsinchu County (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/758,315

(22) Filed: Jan. 15, 2004

(51) Int. Cl.[7] ............................................. H01L 21/44
(52) U.S. Cl. ...................................... 438/677; 438/687
(58) Field of Search ......................... 438/622, 626–641, 438/677–681, 687

(56) References Cited

U.S. PATENT DOCUMENTS

| 5,654,232 | A | | 8/1997 | Gardner | 438/661 |
|---|---|---|---|---|---|
| 6,162,727 | A | * | 12/2000 | Schonauer et al. | 438/687 |
| 6,355,571 | B1 | | 3/2002 | Huang et al. | 438/706 |
| 6,429,128 | B1 | | 8/2002 | Besser et al. | 438/687 |
| 6,482,755 | B1 | | 11/2002 | Ngo et al. | 438/792 |
| 6,500,754 | B1 | | 12/2002 | Erb et al. | 438/626 |
| 6,506,677 | B1 | | 1/2003 | Avanzino et al. | 438/687 |
| 6,515,373 | B2 | | 2/2003 | Barth | 257/781 |
| 2003/0114000 | A1 | * | 6/2003 | Noguchi | 438/687 |

OTHER PUBLICATIONS

Co–pending U.S. Appl. No. 09/998,787, filed Oct. 31, 2001, to the same assignee, "A Solution to the Problem of Copper Hillocks".

* cited by examiner

Primary Examiner—Asok Kumar Sarkar

(57) ABSTRACT

A method of reducing copper hillocks in copper metallization is described. An opening is made through a dielectric layer overlying a substrate on a wafer. A copper layer is formed overlying the dielectric layer and completely filling the opening. The copper layer is polished back to leave the copper layer only within the opening. Copper hillocks are reduced by applying F ions to the copper layer to form a buffer zone on a surface of the copper layer and in-situ depositing a capping layer overlying the copper layer. The F ions remove copper oxide naturally formed on the copper surface and the buffer zone transfers thermal vertical strain in the copper to horizontal strain thereby preventing formation of copper hillocks.

19 Claims, 4 Drawing Sheets

US 6,897,147 B1

SOLUTION FOR COPPER HILLOCK INDUCED BY THERMAL STRAIN WITH BUFFER ZONE FOR STRAIN RELAXATION

BACKGROUND OF THE INVENTION (1) Field of the Invention

The invention relates to a method of copper metallization in the fabrication of integrated circuits, and more particularly, to a method of reducing the formation of copper hillocks in copper metallization in the manufacture of integrated circuits.

(2) Description of the Prior Art

In a common application for integrated circuit fabrication, a contact/via opening is etched through an insulating layer to an underlying conductive area to which electrical contact is to be made. A conducting layer material is deposited within the contact/via opening. Because of its lower bulk resistivity, Copper (Cu) metallization is the future technology for feature sizes of 0.18 microns and below. Often, a damascene or dual damascene process is used to provide Cu metallization. The copper is deposited within the damascene opening and polished back. Then, a capping layer, such as silicon nitride or silicon carbide, is deposited over the copper plugs to prevent copper from diffusing into overlying layers.

During the deposition of the capping layer, the thermal budget will induce compressive-thermal stress on the copper, causing a vertical strain on the copper surface. FIG. 1A illustrates a copper damascene line 20 within an insulating layer 18 on a substrate 10. Copper oxide 22 has formed naturally on the surface of the copper after planarization. FIG. 1B shows the compressive-thermal stress 30 acting along grain boundaries within the copper during deposition of the capping layer 40. FIG. 1C shows copper hillocks 32 formed by the vertical thermal strain on the copper surface. Copper hillocks reduce copper reliability, cause via induced metal island corrosion (VIMIC), and confuse defect inspection tools so that other defects cannot be detected accurately. Reduction of copper hillocks in the copper damascene process becomes more and more important for yield and reliability improvement. It is desired to reduce copper hillock generation in the copper metallization process.

Co-pending U.S. patent application Ser. No. 09/998,787 (TS00-863), filed on Oct. 31, 2001, to the same assignee as the present invention discloses a method of reducing copper hillocks by 1) pre-coating an oxide layer on the deposition chamber walls, 2) using $NH_3$ plasma rather than $NH_3$ gas in the deposition chamber, and 3) keeping the time between copper CMP and capping layer deposition to less than one day (24 hours). U.S. Pat. No. 6,355,571 to Huang et al discloses the use of $NH_3$ or $H_2$ to reduce CuO to copper and an in-situ deposition of a capping layer. U.S. Pat. No. 6,506,677 Avanzino et al and U.S. Pat. No. 6,429,128 to Besser et al teach $NH_3$ and $N_2$ plasma to reduce CuO to Cu and an in-situ deposition of a capping layer. Besser et al alternatively teaches depositing the capping layer at reduced RF power and increased spacing to reduce compressive stress. U.S. Pat. No. 5,654,232 to Gardner teaches a copper damascene process. U.S. Pat. No. 6,482,755 to Ngo et al shows treatment in $NH_3$, $NH_2$, or $H_2$ plasma at a reduced temperature to reduce CuO to Cu, then in-situ deposition of HDP silicon nitride. U.S. Pat. No. 6,515,373 to Barth describes annealing before and/or after CMP to reduce hillocks. U.S. Pat. No. 6,500,754 to Erb et al discloses annealing prior to CMP wherein the annealing stimulates grain growth to prevent hillock formation.

SUMMARY OF THE INVENTION

A principal object of the present invention is to provide an effective and very manufacturable method of reducing copper hillocks in a copper metallization process in the fabrication of integrated circuit devices.

Another object of the invention is to provide a method for reducing copper hillocks by forming a buffer zone on the copper grain boundary.

A further object of the invention is to provide a method for reducing copper hillocks by creating an ionized F or controlled corrosion gas on the copper grain boundary in-situ with the capping layer deposition to form a buffer zone on the copper grain boundary.

In accordance with the objects of this invention a new method of reducing copper hillocks in copper metallization is achieved. An opening is made through a dielectric layer overlying a substrate on a wafer. A copper layer is formed overlying the dielectric layer and completely filling the opening. The copper layer is polished back to leave the copper layer only within the opening. Copper hillocks are reduced by applying F ions or a controlled corrosion gas on the copper grain boundaries to the copper layer to form a buffer zone on a surface of the copper layer and in-situ depositing a capping layer overlying the copper layer. The F ions or controlled corrosion gas on the copper grain boundaries removes copper oxide naturally formed on the copper surface and the buffer zone transfers thermal vertical strain in the copper to horizontal strain thereby preventing formation of copper hillocks.

BRIEF DESCRIPTION OF THE DRAWINGS

In the accompanying drawings forming a material part of this description, there is shown.

DESCRIPTION OF THE PREFERRED EMBODIMENTS

The present invention provides a method for reducing copper hillocks. Hillocks reduce copper reliability and confuse defect inspection tools. Copper hillock generation after capping layer deposition is caused by compressive-thermal stress on the copper causing a vertical thermal strain on the copper surface.

Figure 1A:
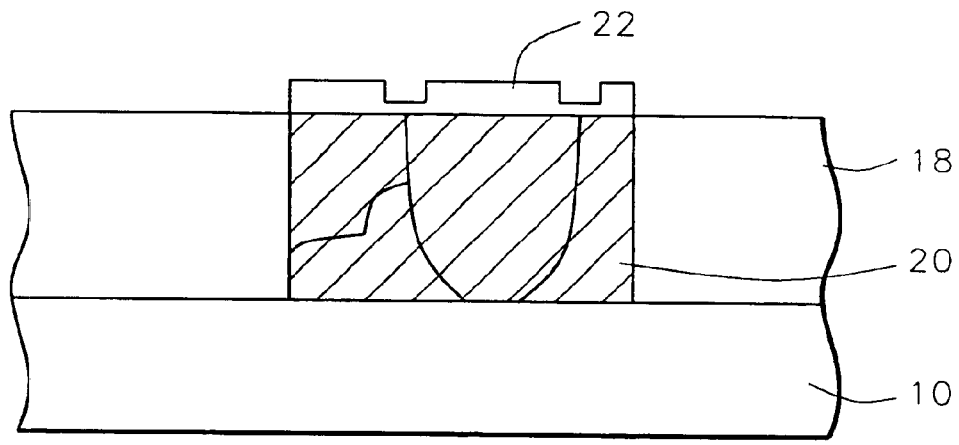
FIGS. 1A through 1C schematically illustrate in cross-sectional representation the copper hillock problem of the prior art.
Figure 1B:
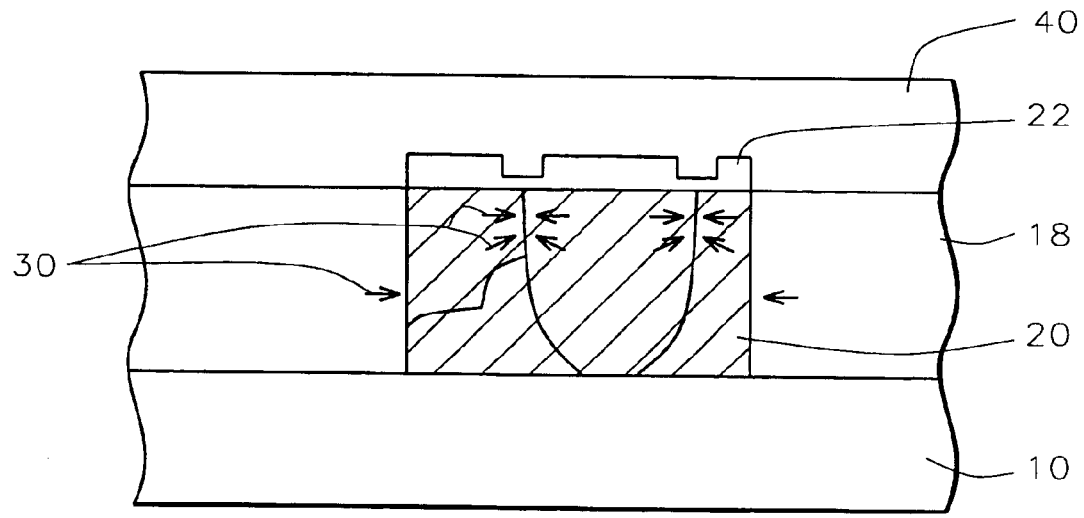
Figure 1C:
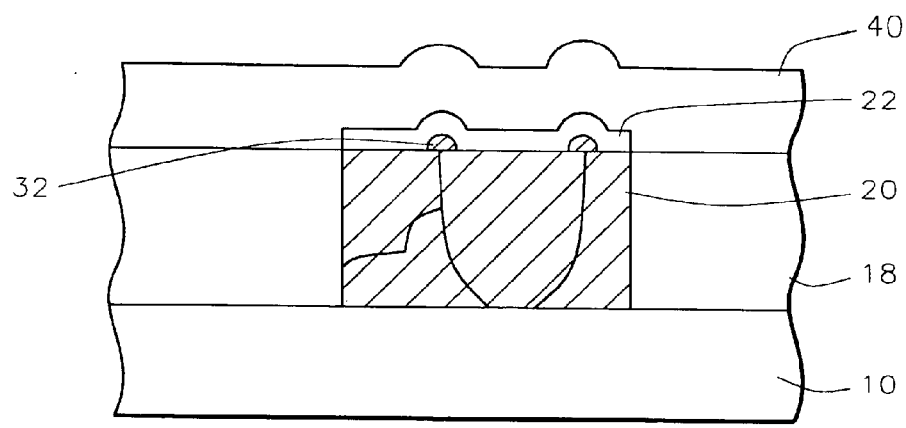
Figure 2:
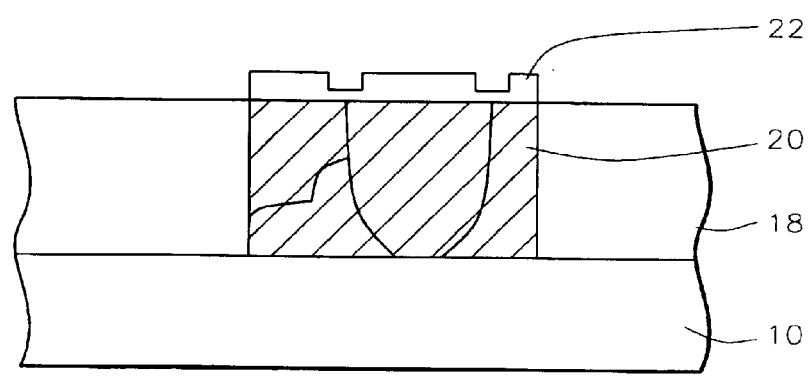
FIGS. 2 through 5 schematically illustrate in cross-sectional representation a preferred embodiment of the present invention.

Referring now more particularly to FIG. 2, there is illustrated a portion of a partially completed integrated circuit device. There is shown a semiconductor substrate 10, preferably composed of monocrystalline silicon. Semiconductor devices structures may be formed in and on the semiconductor substrate. For example, gate electrodes and source/drain regions as well as lower levels of metallization, not shown, may be formed.

An insulating layer 18, composed of silicon dioxide, borophosphosilicate glass (BPSG), borosilicate glass (BSG), phosphosilicate glass (PSG), or the like, is deposited over the semiconductor structures to a thickness of between about 6000 and 13,000 Angstroms and preferably planarized.

A contact/via opening is etched through the insulating layer 18 to one of the semiconductor device structures within the substrate 10, not shown. The opening may be a single or dual damascene opening, for example.

Now, a barrier layer may be deposited, not shown. A copper layer 20 is deposited to fill the opening, as shown in FIG. 2. The copper layer may be deposited by physical or chemical vapor deposition, electroplating, or electroless plating, for example. The copper layer is polished such as by chemical mechanical polishing (CMP) to leave the copper layer only within the opening. A copper oxide layer 22 naturally forms on the copper surface.

Now, a capping layer is to be deposited over the copper line to prevent copper diffusion. Typically, a silicon nitride or silicon carbide layer, for example, is deposited over the copper line. The thermal budget used in depositing the capping layer will cause the formation of hillocks, as discussed above. A key to reducing hillocks is to release the vertical thermal stress within the copper.

In the key process of the present invention, an in-situ step is added to the capping layer deposition to relax the vertical strain at the copper surface. Ionized fluorine (F) or a controlled corrosion gas on the copper grain boundary is applied to the copper surface. The ionized F or controlled corrosion gas on the copper grain boundary enhances the grain boundary of the copper surface. The F ions or controlled corrosion gas on the copper grain boundary will remove the CuO and react with the Cu. Because the grain boundary is a weaker point on the copper surface, the etch rate of the F ions at the grain boundary is faster than any other place.

Figure 3:
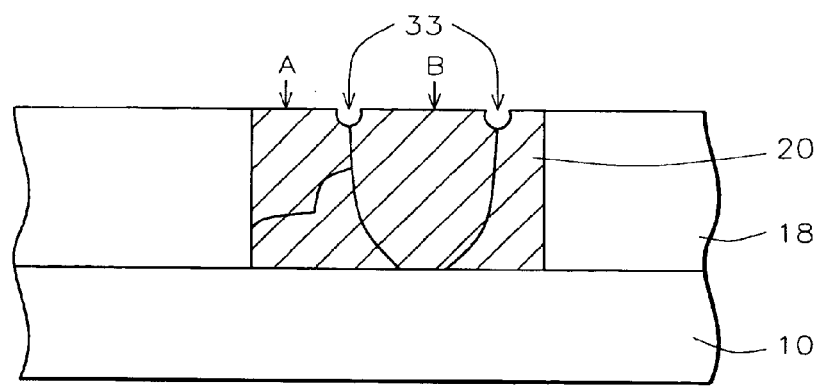

As shown in FIG. 3, the orientations of the grain at A and B are different. A buffer zone comprising shallow trenches 33 between A and B at the grain boundaries is formed, causing dislocation between A and B. For example, NF3 is ionized to N and F ions by a plasma flow into the deposition chamber. Only the F ions will etch the copper grain and grain boundaries. The etch rate of the grain boundaries is faster, forming the buffer zone on the grain boundaries. After thermal cycling during in-situ deposition of the capping layer, the copper grains expand. The grains at A and B can follow their preferred orientation. The buffer zone, shallow trenches 33, provides space from vertical to horizontal.

Figure 4:
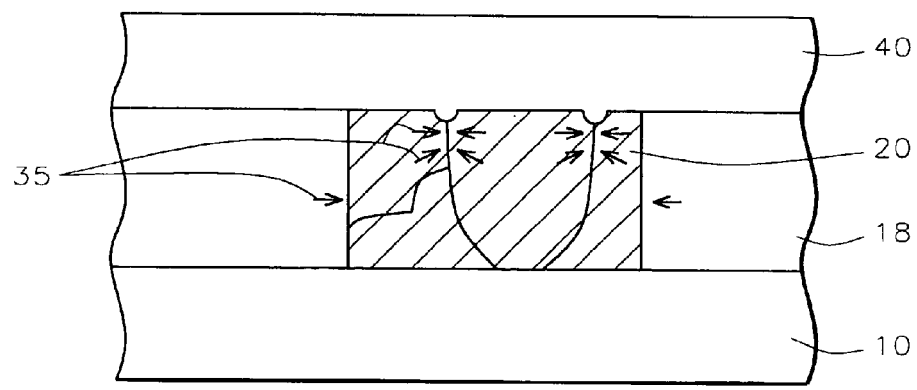

Now, the capping layer is deposited in-situ. No F ions are applied during the deposition process. Capping layer 40 is shown in FIG. 4. The buffer zone transfers the vertical thermal strain 35 into horizontal thermal strain. The expansion of the copper grains fills the shallow trenches 33. The shallow trenches provide space for the copper grain expansion, thus preventing the formation of copper hillocks.

Figure 5:
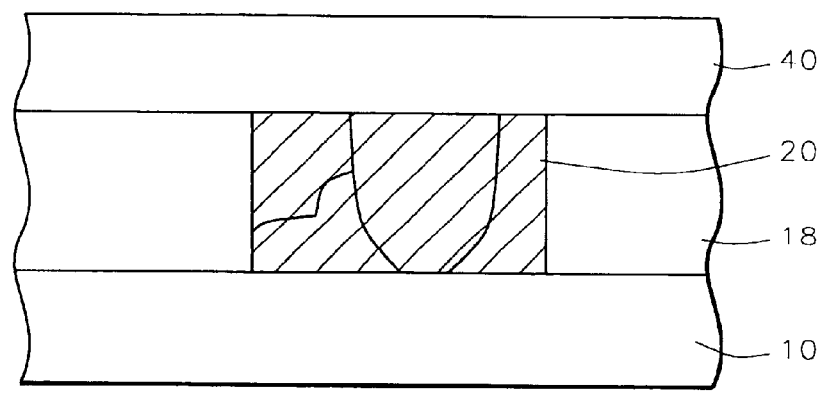

Now, as shown in FIG. 5, copper 20 has filled in the shallow trenches 33. The capping layer 40 is complete. The capping layer comprises silicon nitride or silicon carbide, for example, having a thickness of between about 200 and 1000 Angstroms.

Figure 6:
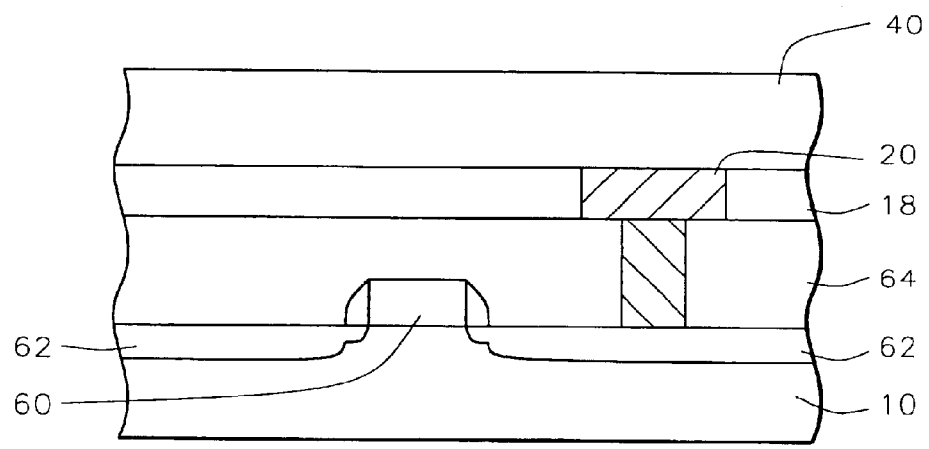
FIG. 6 schematically illustrates in cross-sectional representation a completed integrated circuit device fabricated by a preferred embodiment of the present invention.

This completes the copper metallization. Hillocks are reduced in the process of the invention. Processing now continues as is conventional in the art. For example, higher levels of metallization may be fabricated. The in-situ F ionization of the present invention may be used in subsequent copper levels to further reduce copper hillocks. FIG. 6 illustrates an example of an integrated circuit device having gate electrode 60, source and drain regions 62, metal plug 66 through dielectric layer 64, and the copper line 20 formed by the process of the present invention described above.

The process of the present invention reduces copper hillock formation by creating an ionized buffer zone to transfer vertical strain to horizontal strain thereby preventing the formation of copper hillocks.

While the invention has been particularly shown and described with reference to the preferred embodiments thereof, it will be understood by those skilled in the art that various changes in form and details may be made without departing from the spirit and scope of the invention.

What is claimed is:

1. A method of copper metallization in the fabrication of an integrated circuit device comprising:

providing an opening through a dielectric layer overlying a substrate on a wafer;

forming a copper layer to completely fill said opening;

forming a buffer zone on a surface of said copper layer by exposing said copper layer to an $NF_3$ plasma; and depositing a capping layer overlying said copper layer and said buffer zone to complete said copper metallization in said fabrication of said integrated circuit device.

2. The method according to claim 1 further comprising forming semiconductor device structures in and on said substrate wherein said semiconductor device structures include gate electrodes, source/drain regions, and lower level metallization.

3. The method according to claim 2 wherein said opening is made to one of said semiconductor device structures within said substrate.

4. The method according to claim 1 wherein said depositing said capping layer is an in-situ process.

5. The method according to claim 1 wherein said step of forming said copper layer is selected from the group consisting of: physical vapor deposition, chemical vapor deposition, electroplating, and electroless plating.

6. The method according to claim 1 wherein said step of forming a buffer zone comprises applying controlled corrosion gas to said copper surface.

7. The method according to claim 1 wherein said capping layer is selected from the group consisting of silicon nitride and silicon carbide and wherein said capping layer has a thickness of between about 200 and 1000 Angstroms.

8. A method of copper metallization in the fabrication of an integrated circuit device comprising:

providing an opening through a dielectric layer overlying a substrate on a wafer;

forming a copper layer to completely fill said opening; and treating said copper layer with $NF_3$ plasma to form a buffer zone on a surface of said copper layer and in-situ depositing a capping layer overlying said copper layer to complete said copper metallization in said fabrication of said integrated circuit device.

9. The method according to claim 8 further comprising forming semiconductor device structures in and on said substrate wherein said semiconductor device structures include gate electrodes, source/drain regions, and lower level metallization.

10. The method according to claim 9 wherein said opening is made to one of said semiconductor device structures within said substrate.

11. The method according to claim 8 wherein said step of forming said copper layer is selected from the group consisting of: physical vapor deposition, chemical vapor deposition, electroplating, and electroless plating.

12. The method according to claim 8 herein said capping layer is selected from the group consisting of silicon nitride and silicon carbide and wherein said capping layer has a thickness of between about 200 and 1000 Angstroms.

13. A method of copper metallization in the fabrication of an integrated circuit device comprising:

providing an opening through a dielectric layer overlying a substrate on a wafer;

forming a copper layer to completely fill said opening wherein copper oxide forms naturally on a surface of said copper layer; and applying a gas containing F ions to said copper layer wherein said F ions remove said copper oxide and form a buffer zone on a surface of said copper layer and in-situ depositing a capping layer overlying said copper layer to complete said copper metallization in said fabrication of said integrated circuit device.

14. The method according to claim 13 further comprising forming semiconductor device structures in and on said substrate wherein said semiconductor device structures include gate electrodes, source/drain regions, and lower level metallization.

15. The method according to claim 14 wherein said opening is made to one of said semiconductor device structures within said substrate.

16. The method according to claim 13 wherein said step of forming said copper layer is selected from the group consisting of: physical vapor deposition, chemical vapor deposition, electroplating, and electroless plating.

17. The method according to claim 13 wherein said step of applying a gas containing F ions to said copper layer comprises treating said copper with $NF_3$ plasma.

18. The method according to claim 13 wherein said buffer zone transfers thermal vertical strain in said copper to horizontal strain thereby preventing formation of copper hillocks.

19. The method according to claim 13 wherein said capping layer is selected from the group consisting of silicon nitride and silicon carbide and wherein said capping layer has a thickness of between about 200 and 1000 Angstroms.

* * * * *

UNITED STATES PATENT AND TRADEMARK OFFICE
CERTIFICATE OF CORRECTION

PATENT NO.    : 6,897,147 B1
DATED         : May 24, 2005
INVENTOR(S)   : Shih-Yen Tsal et al.

It is certified that error appears in the above-identified patent and that said Letters Patent is hereby corrected as shown below:

<u>Title page,</u>
Item [75], Inventors, "Shin-Yeu Tsai," should read -- Shih-Yen Tsal. --.

Signed and Sealed this

Sixth Day of December, 2005

JON W. DUDAS
*Director of the United States Patent and Trademark Office*

UNITED STATES PATENT AND TRADEMARK OFFICE
CERTIFICATE OF CORRECTION

PATENT NO. : 6,897,147 B1  Page 1 of 1
APPLICATION NO. : 10/758315
DATED : May 24, 2005
INVENTOR(S) : Shih-Yen Tsal et al.

It is certified that error appears in the above-identified patent and that said Letters Patent is hereby corrected as shown below:

Title page,
Item [75], Inventors, "Shin-Yeu Tsai," should read -- Shih-Yen Tsai. --.

This certificate supersedes Certificate of Correction issued December 6, 2005.

Signed and Sealed this

Thirteenth Day of February, 2007

JON W. DUDAS
*Director of the United States Patent and Trademark Office*